United States Patent [19]

Kubodera et al.

[11] Patent Number: 5,445,675
[45] Date of Patent: Aug. 29, 1995

[54] SEMICONDUCTOR PROCESSING APPARATUS

[75] Inventors: Masao Kubodera; Shigeru Kasai; Hatsuo Osada, all of Yamanashi, Japan

[73] Assignee: Tel-Varian Limited, Nirasaki, Japan

[21] Appl. No.: 87,873

[22] Filed: Jul. 9, 1993

[30] Foreign Application Priority Data

Jul. 9, 1992 [JP] Japan .................. 4-205908
Jan. 22, 1993 [JP] Japan .................. 5-027404

[51] Int. Cl.⁶ .................................. C23C 16/00
[52] U.S. Cl. .......................... 118/719; 118/725
[58] Field of Search ......................... 118/725, 719

[56] References Cited

U.S. PATENT DOCUMENTS

| | | | |
|---|---|---|---|
| 4,680,451 | 7/1987 | Grat | 118/725 |
| 4,773,355 | 9/1988 | Reif | 118/725 |
| 4,836,138 | 6/1989 | Robinson | 118/725 |
| 4,854,263 | 8/1989 | Chang | 118/725 |

FOREIGN PATENT DOCUMENTS 58-164222 9/1983 Japan .

*Primary Examiner*—Richard Bueker
*Attorney, Agent, or Firm*—Oblon, Spivak, McClelland, Maier & Neustadt

[57] ABSTRACT

A semiconductor processing apparatus comprises a vacuum processing chamber and a lamp house provided thereunder. A susceptor is provided in the processing chamber, and a semiconductor wafer is mounted thereon. The processing chamber and the lamp house are partitioned by a widow plate made of quartz glass in an airtight state. Eight light sources for heating are arranged in a circumferential form on a rotatable table at the portion which is in the lamp house and under the window plate. A sensor comprising a thermocouple for detecting energy of transmitted light is provided between the susceptor and the window plate. The sensor is connected to a measuring section comprising an A/D converter, and thereby detected data is converted from a digital signal to an observed value. The observed value is sent to a comparator to be compared with a predetermined reference model. A comparative result obtained by the comparator is transmitted to a controlling section. The control section induces the state of the window plate from the comparative result, and stops the power supply to the light source when the detected energy of the transmitted light is lower than a predetermined limit.

17 Claims, 7 Drawing Sheets

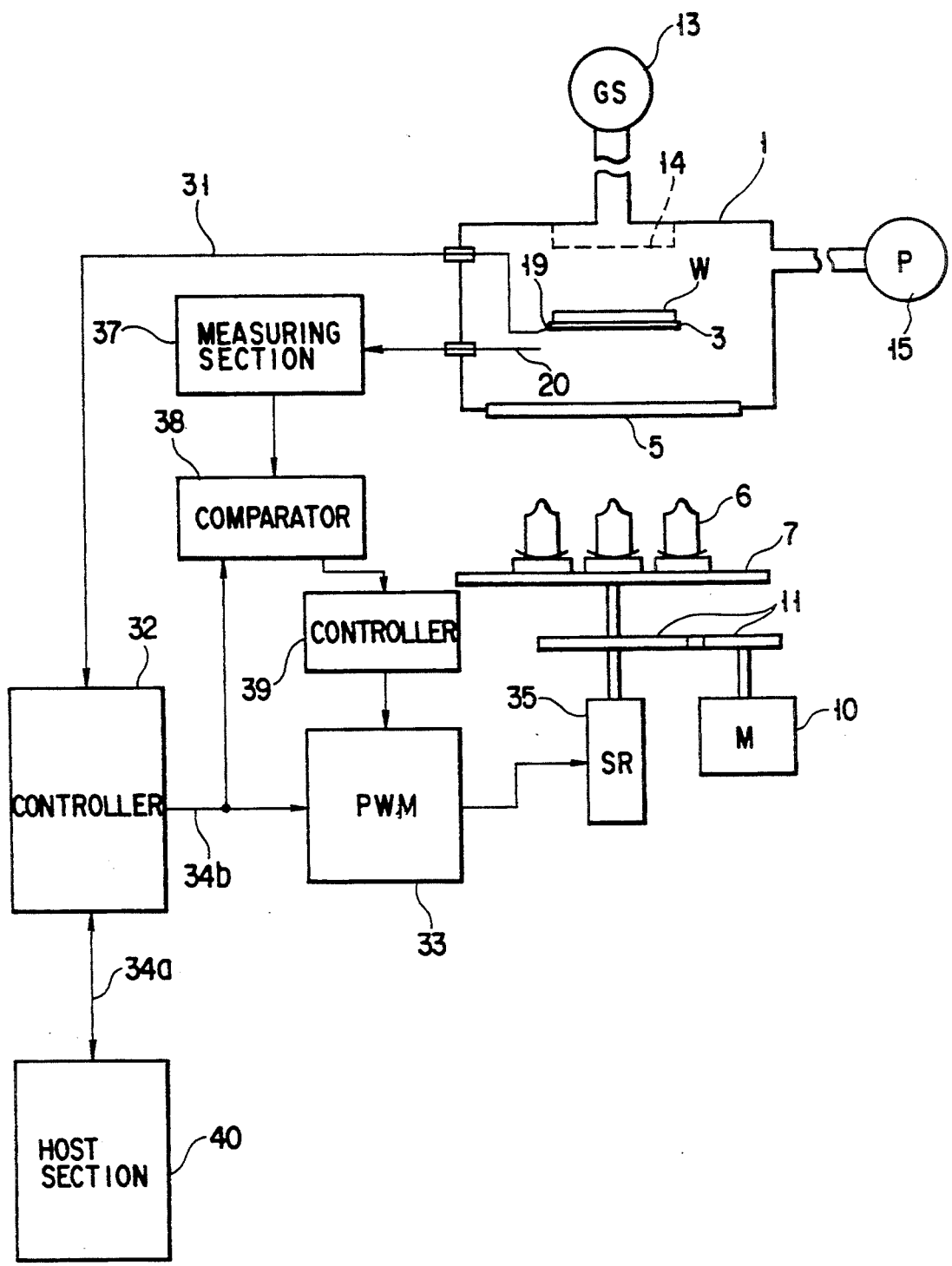
F I G. 1

SEMICONDUCTOR PROCESSING APPARATUS

BACKGROUND OF THE INVENTION

1. Field of the Invention

The present invention relates to a semiconductor processing apparatus and, particularly to a CVD (Chemical Vapor Deposition) apparatus for processing a semiconductor wafer while being optically heated.

2. Description of the Related Art

In a manufacturing process of a semiconductor device, a sputter apparatus and a CVD apparatus are used, and a thin film is formed on a semiconductor wafer. In such a film forming process, in order to uniformly grow the thin film on the wafer, it is important to heat and maintain an entire surface of the wafer at a predetermined temperature. A heating method can be roughly classified to heating by a heater and heating by an energy line, e.g., light of a lamp. The lamp heating is often used in a semiconductor manufacturing device in which an object is mounted in vacuum atmosphere since heat energy is transmitted in vacuum by radiation.

The conventional vacuum processing apparatus of lamp heating type comprises a vacuum chamber in which a mount base of a semiconductor wafer is arranged, and a heating lamp arranged outside the chamber. A wall of the chamber, which is opposite to the lamp, is formed of a window plate made of quartz glass. Light emitted from the lamp is radiated into the chamber through the window plate. The lamp is arranged to heat the mount base, so that the wafer on the mount base is heated over the entire surface from the rear surface.

An exhaust pump and a process gas source are connected to the vacuum chamber, and a predetermined vacuum atmosphere is given to the vacuum chamber, and process gas is supplied thereto.

Published Unexamined Japanese Patent Application No. 58-164222 discloses a processing apparatus of an infrared lamp heating type.

In the above apparatus, by-products are deposited on the inside of a window plate, so that a film can be easily formed. If such a film is formed, transmitted light is absorbed by the film, and the window plate is heated by absorption light through the film. If this process is repeated, the thickness of the film, which is deposited on the window plate, is increased, and a heating rate of the window plate is increased. In other words, the rate of the rise in temperature of the window plate during the process is also increased.

Even if the window plate is periodically cleaned, light transmissivity of quartz glass, which is altered and weakened by heating, cannot be recovered. In other words, only by removing the film from the surface of the window plate, it is difficult to recover light transmissivity of the window plate and to prevent the window plate from being heated. Inventors of the present invention have found out a problem such that if the window glass of quartz glass is periodically cleaned and continuously used, the window plate is finally broken and a clean room, in which the apparatus is arranged, is contaminated.

SUMMARY OF THE INVENTION

An object of the present invention is to provide a semiconductor processing apparatus using light heating, which can prevent a window plate from being broken by a rise in temperature.

According to the present invention, there is provided a semiconductor processing apparatus for processing a substrate to be processed while being optically heated, comprising: a processing chamber; exhausting means for setting the processing chamber to a vacuum atmosphere; supporting means, provided in the processing chamber, for supporting the substrate; a light source, provided outside the processing chamber, for emitting light for heating the substrate; a power supply for supplying electrical power to the light source so as to emit the light; a window plate, provided to be opposite to the light source, and forming a part of a wall of the processing chamber, the window plate transmitting the light emitted from the light source to pass therethrough; detecting means for detecting energy of transmitted light having passed through the window plate, the detecting means having a detection terminal provided between the window plate and the substrate in the processing chamber; comparing means for comparing an observed value of energy of the transmitted light detected by the detecting means with a reference value representing energy of the transmitted light in an initial state of the window plate; and controlling means for inducing a state of the window plate from a comparative result between the observed value and the reference value obtained by the comparing means, and selectively stopping the power supply to the light source from the power source.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing the structure of a CVD device according to a first embodiment of the present invention;

DETAILED DESCRIPTION OF THE PREFERRED EMBODIMENT

Figure 2:
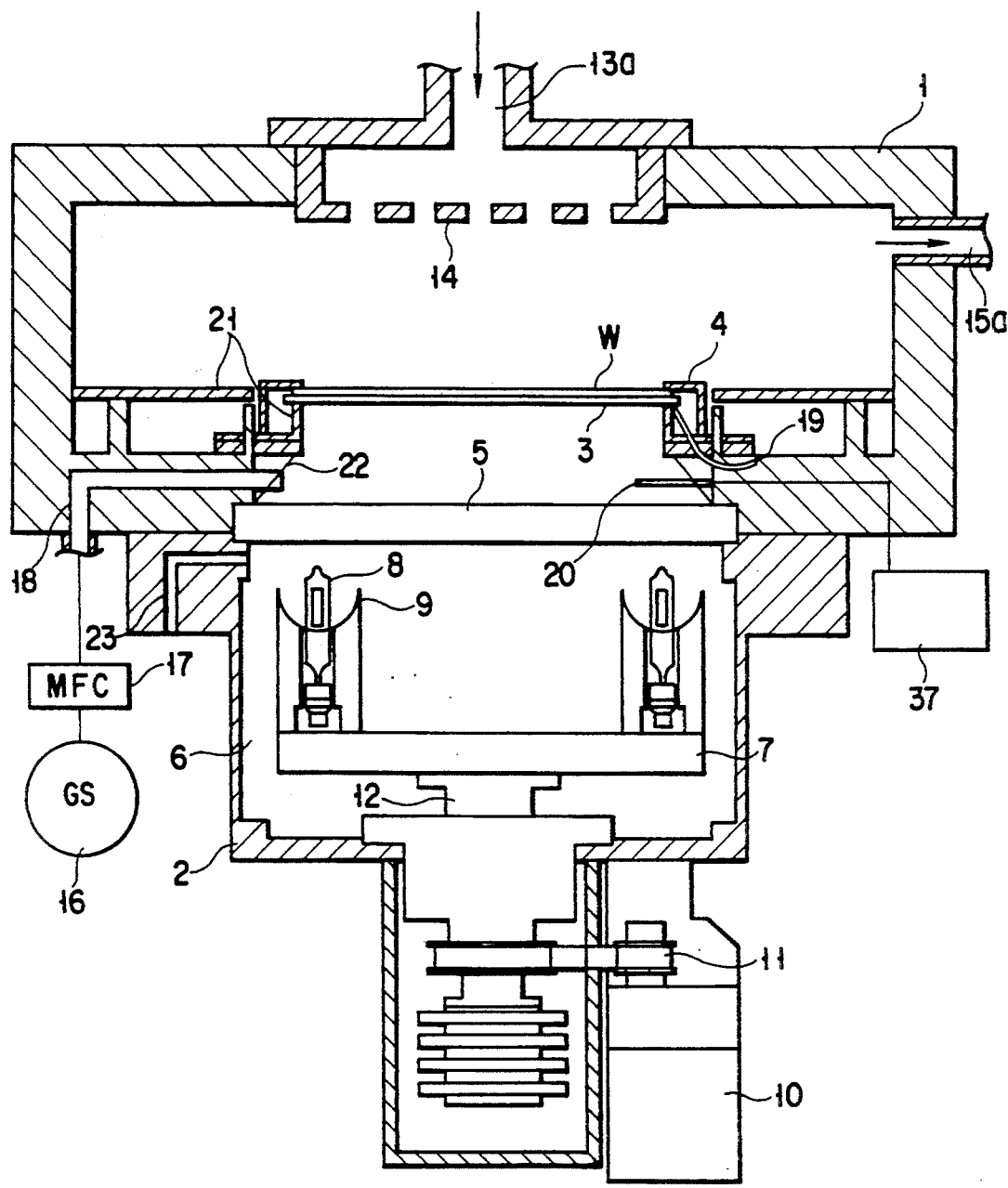
FIG. 2 is a cross sectional view showing the structure of the main parts of the apparatus of the first embodiment.

Embodiments of the present invention will be explained with reference to drawings.

As shown in FIG. 1, a CVD apparatus of a first embodiment of the present invention comprises a vacuum processing chamber 1 and a lamp house 2 provided under the processing chamber 1. The chamber 1 and house 2 are formed of, e.g., an aluminum cylindrical member.

A susceptor 3 is provided in the processing chamber 1, and an object to be processed, e.g., a semiconductor wafer W, is mounted thereon. The susceptor 3 is made of a carbon base material such as amorphous carbon, carbon graphite, or SiC, and has a diameter larger than the 10 wafer W, such as a diameter 3 to 5 mm larger than the wafer of 8", and has a thickness almost the same as or a bit bigger than the wafer W, e.g., of 3 mm. With such a small susceptor, wafer temperature can be controlled to have a steep heating or cooling curve so that the response speed of the apparatus is improved. A clamp 4, which is movable up and down, is provided around the susceptor 3. The clamp 4 has a ring-shape extension 4a, thereby contacting a marginal portion of the wafer W.

The processing chamber 1 and the lamp house 2 are air-tightly partitioned by a window plate 5 made of quartz glass. Since the window plate 5 is used to allow light serving as a heat energy source of wafer W to pass through, it can be formed of other material such as sapphire.

At the portion, which is in the lamp house and under the window plate 5, a plurality of light sources 6 for heating, e.g. eight light sources, are provided on a rotation table 7 in a circumferential form. Each light source 6 comprises a lamp 8 and a reflecting mirror 9 provided therearound. A table 7 is driven to be rotated by a motor 10 through a transmission 11, which comprises pulleys and a belt. Light emitted from the light source 6, which comprises the lamp 8 and the reflecting mirror 9, passes through the window pate 5 and is radiated on a rear surface of the susceptor 3, and heats the wafer W therethrough. In this embodiment, a tungsten lamp, or a halogen lamp, etc is used as lamp 8.

A gas source 13 is connected to a top portion of the processing chamber 1 through a port 13a. In the gas source 13, there is contained a process gas, which is used for forming a film on the surface of the wafer W, such as tungsten hexafluoride for forming a tungsten film. The process gas is supplied onto the main surface of the wafer w in a shower-like manner through holes of a diffusion panel 14 provided in the processing chamber 1.

An exhaust pump 15 is connected to the side portion of the processing chamber 1 through a port 15a. The processing chamber 1 is set to a predetermined vacuum atmosphere suitable for a process reaction, to such as several 10 Torr to $10^{-8}$ Torr by use of the pump 15.

A thermocouple 19 for indirectly detecting a wafer temperature is provided on the rear surface of the susceptor 3. In the example shown in the figure, the number of thermocouple is one. However, a plurality of thermocouples can be provided as required. A shielding plate is used such that light of the light source 6 is not directly radiated to the thermocouple 19. The output voltage of the thermocouple 19 is transmitted to a controller 32 through a signal cable 31.

In the controller 32, a processing program of the CVD apparatus is stored in advance. Also, data of 10 processing of the wafer W is inputted to the controller 32 from a host section 40 via a signal cable 34a. The processing state is outputted to the host section 40 from the controller 32.

The controller 32 outputs a command to a PWM amplifier 33 through a signal cable 34b. The PWA amplifier 33 changes ON/OFF time or duty ratio of a digital signal of a constant frequency, e.g., 2 KHz in accordance with the command. In other words, the amplifier 33 can substantially 0 to 100% vary an amplification value, which is an output, by changing the duty ratio. The amplification value changes an amount of light emission of the lamps 8 through a slip ring (SR) 35.

In the processing chamber 1, a sensor 20 is provided between the susceptor 3 and the window plate 5 so as to detect energy of light from the light source 6 through the window plate 5. In this embodiment, the thermocouple is used as sensor 20. The sensor 20 is connected to an energy measuring section 37.

The energy measuring section 37 comprises an A/D converter to convert detected data from a digital signal to an observed value. The observed value is sent to a comparator 38. The comparator 38 compares the observed value with a predetermined reference model. The comparative result obtained by the comparator 38 is transmitted to a controller 39. A controller 39 controls the PWM amplifier 33 to supply or stop electrical power 10 based on the comparative result.

The top end of the sensor 20 comprising the thermocouple can be adhered to the window plate 5, which is made of quartz glass, by use of low temperature melting glass. The adhering method will be performed as follows:

More specifically, powder low temperature melting glass is dissolved in water. Then, a suitable amount of dissolved glass is adhered to the thermocouple mounted on the surface of the window plate 5 and heated at a sealing temperature by a heating lamp, and maintained for a certain time. Thereby, low temperature melting glass is crystallized and hardened, and the top end of the thermocouple is adhered and fixed to the surface of the window plate 5. In this case, low temperature melting glass, which has a linear expansion coefficient approximately the same as that of quartz glass, is once molten and crystallized, so that sealing strength is extremely improved, and the thermocouple does not come off and dropped even if it is used in the CVD apparatus. By use of low temperature melting glass, it is possible to suppress the generation of a microclearance, which causes increase of heat resistance.

As the sensor 20, it is possible to use an optical fiber in place of the thermocouple. In this case, since the direct detecting object is changed from heat to light, the processing function of the measuring section 37 is changed. For example, a measuring section, which comprises a photoelectric transducer, is favorably used for the detecting section comprising an optical fiber.

As shown in FIG. 2, the susceptor 3 is surrounded with a partition panel 21. The process gas supplied from the holes of the diffusion panel 14 is prevented from easily entering introduced into the rear surface of the wafer W by the susceptor 3 and the partition panel 21. An optical duct 22 is provided between the partition panel 21 and the window plate 5. An inner surface of the optical duct 22 is formed as a reflecting surface, and light, which is emitted from the light source 6, is radiated on the susceptor 3 in a concentration manner.

A gas line 18, which is adjacent to the window plate 5 and which is connected to a source 16 of inactive gas, is provided in the processing chamber 1. A mass flow controller 17 is provided between the line 18 and the source 16, so that the flow of inactive gas is controlled. As inactive gas, Ar, $N_2$, etc., can be used. A space defined by the window plate 5, optical duct 22, and susceptor 3 is set to such a pressure by inactive gas as is higher than that in the process space where the main surface of the water W is arranged. The inactive gas flows through the clearance between the susceptor and the partition panel 21, and is exhausted from an exhaust port 15a by the pump 15.

While the thin film is formed on the wafer w, the inactive gas is supplied onto the window plate 5, so that film formation due to deposition of the by-products on the window plate 5 can be suppressed. Also, the inactive gas prevents the thermocouple 19 and the sensor 20 from being deteriorated by touching the process gas. As a result, the life of the thermocouple can be prolonged about a half year.

Moreover, a cooling air introduction line 23 is formed in the lamp house 2. The overheating of the interior of the lamp house 2 and that of the window plate 5 are suppressed by the introduced cooling air. Further, it is possible to suppress the overheating of the window plate 5 by circulating coolant in the surrounding wall of the lamp house 2.

The following will explain an operation of the above-explained CVD apparatus of lamp heating type.

First, the processing chamber 1 is set to a predetermined vacuum atmosphere in a range of several 10 Torr to $10^{-8}$ Torr by use of the pump 15. Then, a gate (not shown), which is provided between the adjacent load lock chamber and the chamber 1, is opened, and the wafer W is transferred into the processing chamber 1 by a transfer arm (not shown). Then, the wafer W is mounted on a predetermined portion of the susceptor 3, and fixed thereto by the clamp 4.

Next, light sent from the heating light source 6 is radiated on the rear surface of the susceptor 3 through the window plate 5. The wafer W is heated from the room temperature to the film formation processing temperature, such as about 400° C. for a short period of time, such as about 240 seconds. Under a more strict condition, the wafer W is rapidly heated from the room temperature to about 500° C. for about 30 seconds. After the temperature reaches the predetermined temperature, the process gas is introduced into the processing chamber 1 from the port 13a, and the film formation processing is performed.

After the film formation processing is performed for a predetermined period of time, the supply of process gas is stopped, power of the lamps 8 is turned off. Then, the chamber 1 is purged with an inert gas, and process gas in the processing chamber 1 is exhausted by the exhaust pump 15 through the exhaust port 15a. Thereafter, the aforementioned gate is opened, and the processed wafer W is transferred to the adjacent load lock chamber by the transfer arm.

The control of setting the temperature of the wafer W, which is performed at the time of the film formation process, can be performed by one of the following two methods.

One method is that the surface temperature of the wafer W is estimated from the temperature of the peripheral portion of the rear surface of the susceptor 3, which is measured by the thermocouple 19, by the controller 32, thereby controlling the power supply of the lamps 8. In this method, since there occurs delay due to heat transmission in the peripheral portion of the rear surface of the susceptor 3 and the wafer surface such as a central portion, it is difficult to control the temperature of the processing surface with high accuracy. Particularly, when the temperature of the wafer rises, there is a possibility that overshoot heating will be performed.

The other method is that delay due to heat transmission, which is from the peripheral portion of the rear surface of the susceptor 3 to the wafer surface, is incorporated into the controller 32 in advance as a transfer function, and an estimated value of the wafer surface temperature at the time of the rise or fall of the temperature is corrected. According to this method, the temperature control having extremely high responsibility can be performed. Also, the temperature control having high accuracy and little overshoot can be performed even when the rapid heating is performed.

In the case that the estimated temperature of the wafer surface is higher than the predetermined value, the controller 32 reduces the power supply of the PWM amplifier 33 in the same manner that the radiation energy of the lamps 8 is reduced. Conversely, in the case that the estimated temperature of the wafer surface is lower than the predetermined value, the controller 32 increases the power supply of the PWM amplifier 33.

The following will explain an operation of the sensor 20 for protecting the window plate 5.

An inactive gas is supplied from the line 18 to the backside space between the window plate 5 and susceptor 3 such that the pressure thereof is higher than that of the space on the main surface of the water w. However, the process gas is leaked to the backside space from the clearance between the susceptor 3 and the partition plate 21. Due to this, the film is formed on the window plate 5 as the number of wafer processing times is increased.

Then, light emitted from the light source 6 is absorbed by the film, and light transmissivity of the window plate 5 is lowered, and the window plate 5 is heated itself. In this way, the window plate 5 of the quartz glass is deteriorated. Even if the film is cleaned, light transmissivity of the window plate 5 does not return to the original value due to the accumulated alteration. If the window plate 5 is deteriorated and the mechanical strength is lowered, there may occur an accident in which the window plate 5 cannot withstand a pressure difference between the process pressure and an atmospheric pressure and is broken during the film formation process, and the process gas flows into the clean room.

The sensor 20 is used to prevent such an accident from occurring in advance. The sensor 20 detects thermal energy of light emitted from the light sources 6 through the window plate 5, and transmits it to the measuring section 37. The measured or observed value, which is converted to a digital signal by the measuring section 37, is transmitted to the comparator 38. In a case that the window plate 5 is new, that is, in an initial state, the relationship between power supplies to the lamps 8 and the values measured by the measuring section 37 is stored in the comparator 38 as a reference model in advance. The observed value is compared with the standard model by the comparator 38, and the result is transmitted to the controller 39. The controller 39 controls the PWM amplifier 33 to perform and stop the power supply to the lamp 8 based on the comparative result.

If the comparator 38 discriminates that there is abnormality in the window plate 5 and the power supply to the lamp 8 is stopped, the controller 39 transmits this data to the host section 40. The host section 40 display the abnormality of the window plate 5 based on the transmitted data. An operator can confirm the abnormality of the window 5 by the display and clean or exchange the window plate.

Figure 3:
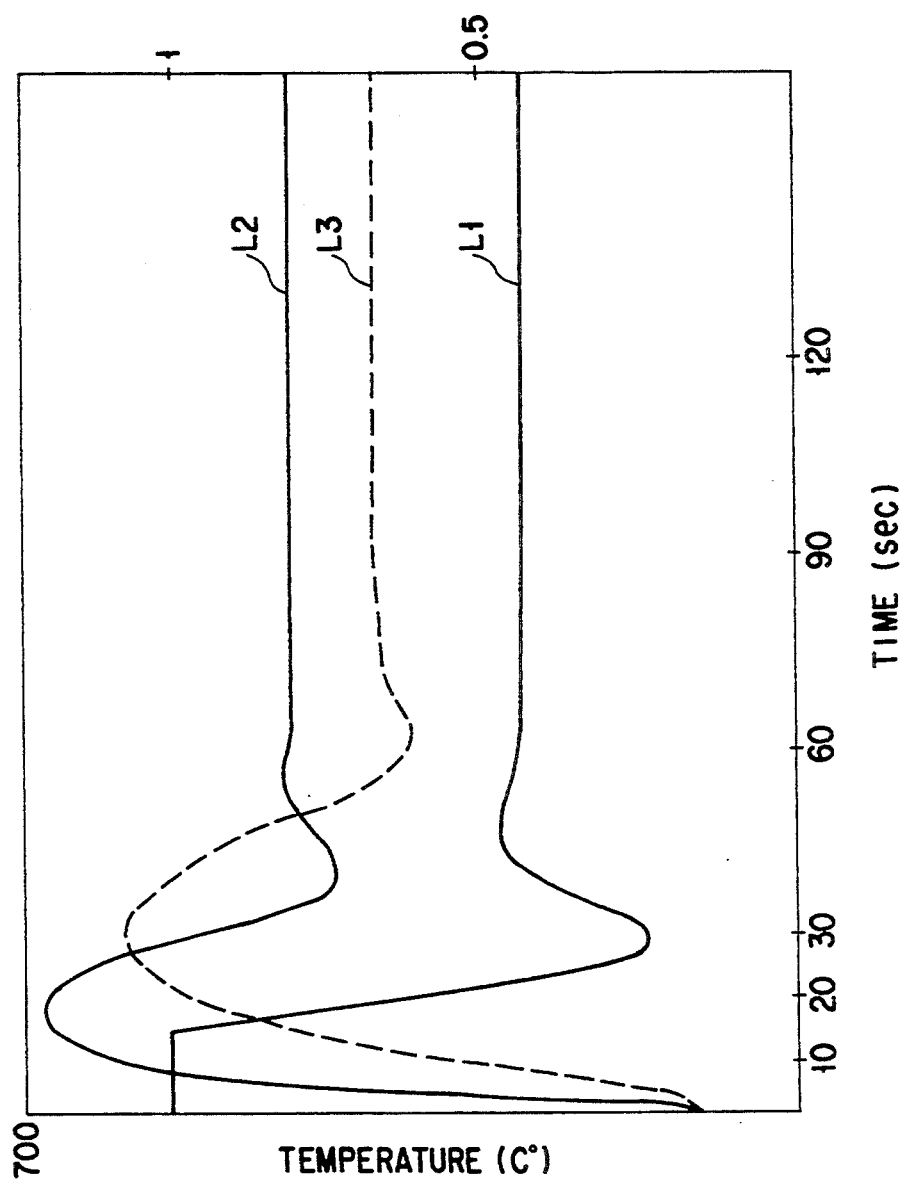
FIG. 3 is a graph showing the relationship between electric power to be supplied to a lamp and a temperature detected by a sensor.

FIG. 3 shows the relationship between power supply to the lamps 8 and the value measured by the measuring section 37 through the sensor 20, that is, the temperature, in the case that the temperature of the wafer W is increased from the ordinary temperature to 500° C. for about 30 seconds. Line L1 shows supply power. Line L2 shows a measured value (reference model) of the window plate 5, which is new. Line L3 shows an observed value in a state that by-products are deposited on the window plate 5 and a film product is formed thereon, and cleaning or replacement of the window plate 5 is needed.

According to the present invention, the comparator 38 compares an observed line obtained from the observed value of the measuring section 38 with reference model line L2, so that the degree of the film formation on the window plate 5 is induced. For example, as is obvious from the comparison between line L2 and line L3, if the film is adhered to the window plate 5, the inclined angle of the line at the rise of temperature becomes gentle. Particularly, in consideration of this point, it is possible to speedily detect that the film is adhered to the window plate 5, thereby making it possible to prevent the window plate 5 from being overheated in advance.

The comparison between the observed value and the reference model can be made by various types of algorithm. For example, as a simple example, if attention is paid to the angle of the line at the time of the rise of the temperature, a deviation between a differential value of the reference model line and that of the observed line can be set as a function of the degree of film formation. More specifically, it is possible to set up a limit whether or not the differential value of the observed line is within the range of, e.g., 90% to 100% of the differential value of the reference model line.

Moreover, if a limit model line of the allowable range shown by line L3 of FIG. 3 is obtained, and inputted to the comparator 38 in advance, this can be used as an index for outputting a signal showing that the cleaning or replacement of the window plate 5 is needed. In this case, a state between the standard and the limit model line can be set as tolerance.

In the apparatus explained in the above embodiment, it is possible to detect that one of the lamps 8 is burned out. More specifically, the plurality of lamps, e.g., 8 lamps are provided on a rotation table 7 in a circumferential form. Even if one of lamps is burned out, the total amount of consumption electrical power of the lamps 8 is reduced. Therefore, it is possible to confirm that one of the lamps 8 is burned out by monitoring the consumption electrical power of the lamps 8. Data of burned-out lamp is transmitted to the host section 40, and displayed.

Figure 4:
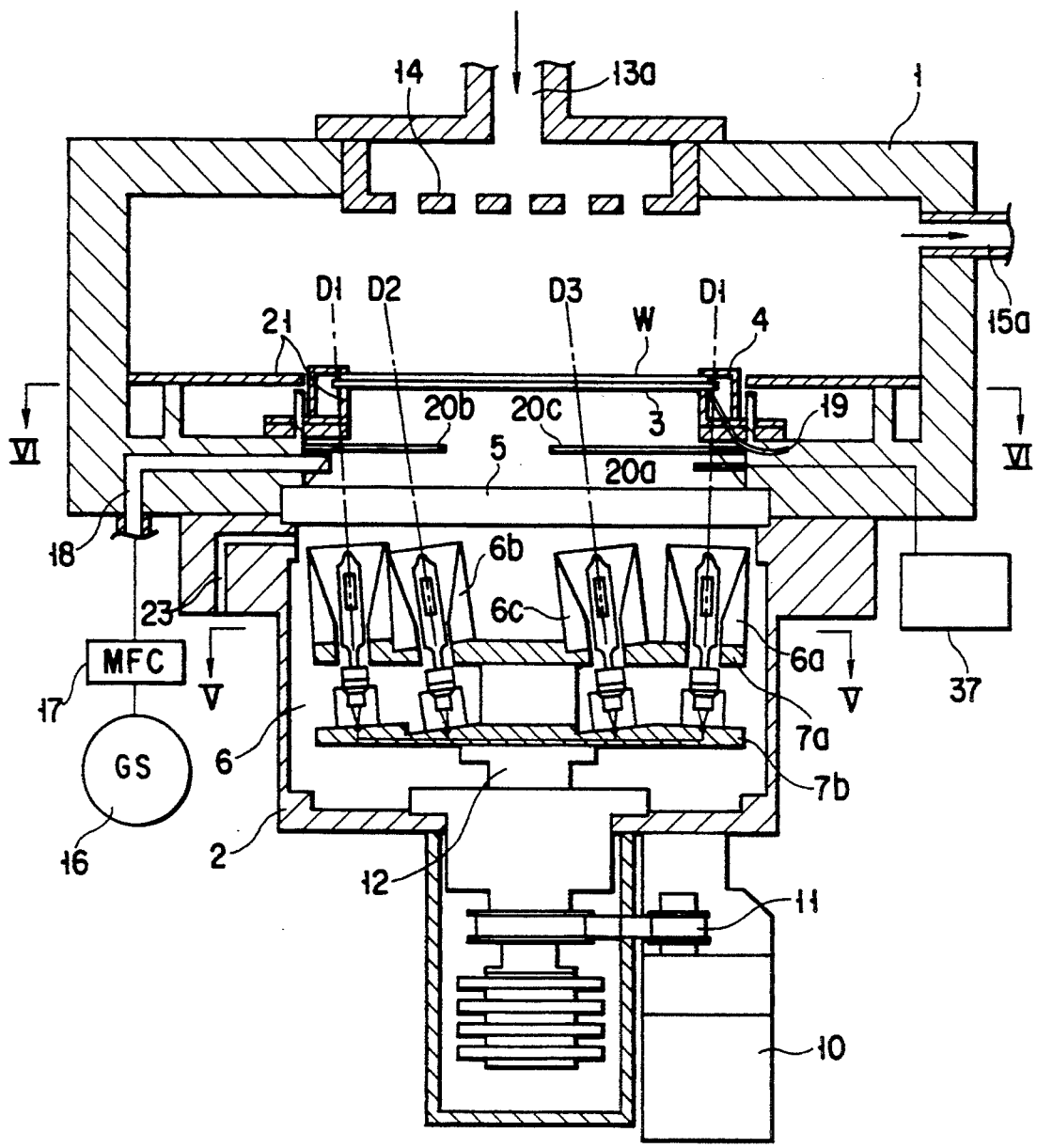
FIG. 4 is a cross sectional view showing the structure of the main parts of the apparatus of a second embodiment.

The following will explain a CVD apparatus according to a second embodiment of the present invention with reference to FIG. 4.

In the figure, the same reference numerals are added to the portions corresponding to the portions used in FIGS. 1 and 2, and the explanation will be omitted.

The different point between the first embodiment and the second embodiment is that light sources 6 are arranged such that these light sources 6 share three radiation zones.

Figure 5:
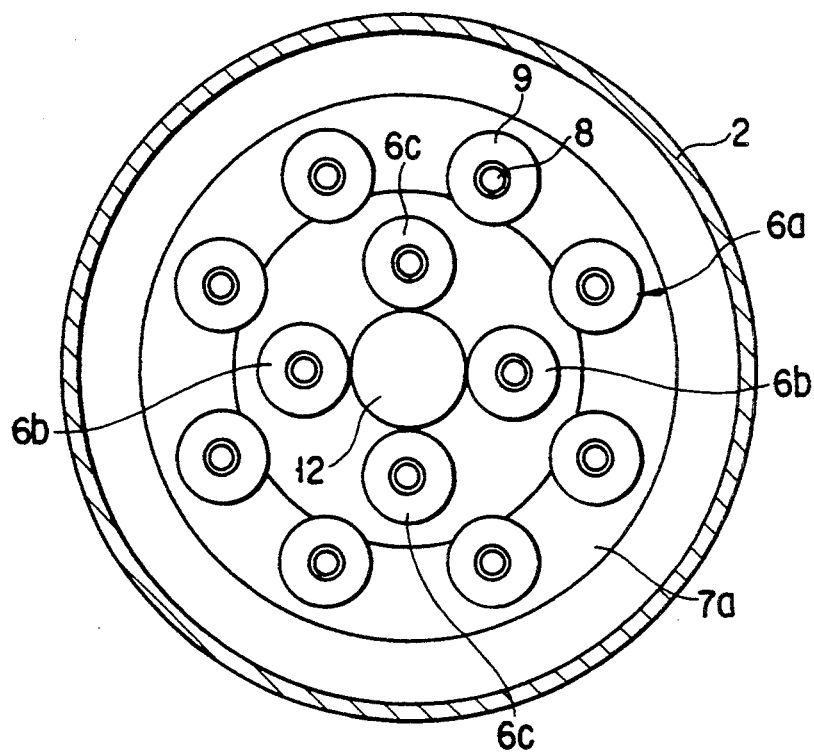
FIG. 5 is a transverse cross sectional view taken along line V—V of FIG. 4.

Similar to the first embodiment, each light source 6 comprises a lamp 8 and a reflecting mirror 9 provided therearound. The light sources 6 are fixed to rotation tables 7a and 7b, which are structured to be two-layered upper and lower. The reflecting mirrors 9 are supported on the upper side table 7a, and the lamps 8 are supported on the lower side table 7b. The light sources 6 consist of eight light sources 6a, which are arranged outside in a circumferential form as shown in FIG. 5 showing a cross sectional view taken along line V—V of FIG. 4, and four light sources 6b and 6c, which are arranged inside in a circumferential form. The number of light sources and the arrangement are just shown as an example, and the present invention is not limited to this example.

Figure 6:
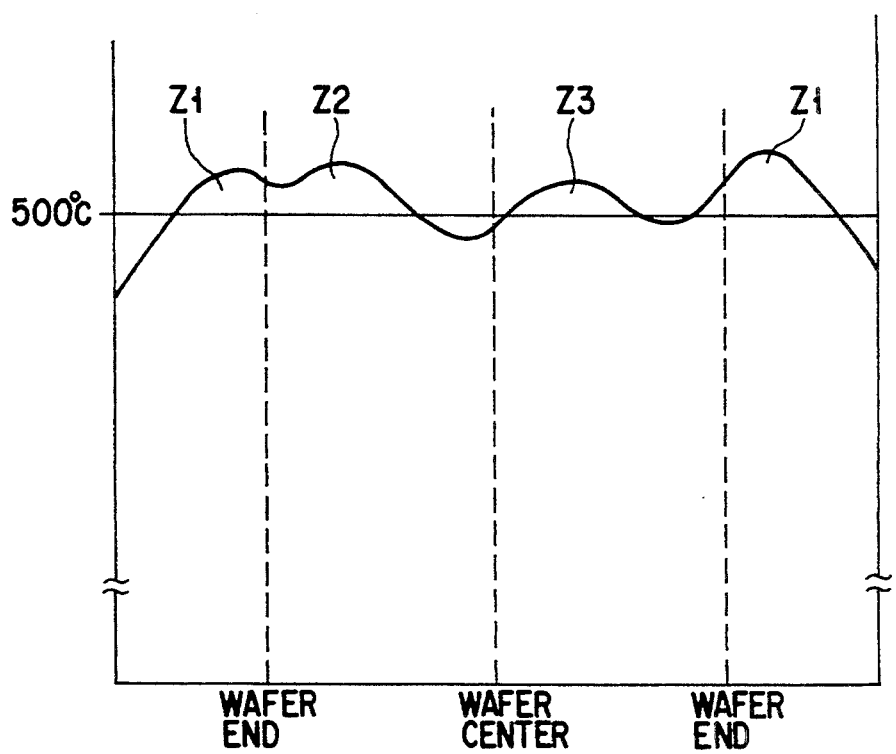
FIG. 6 is a graph showing a temperature distribution at the position along line VI—VI of FIG. 4.
Figure 7:
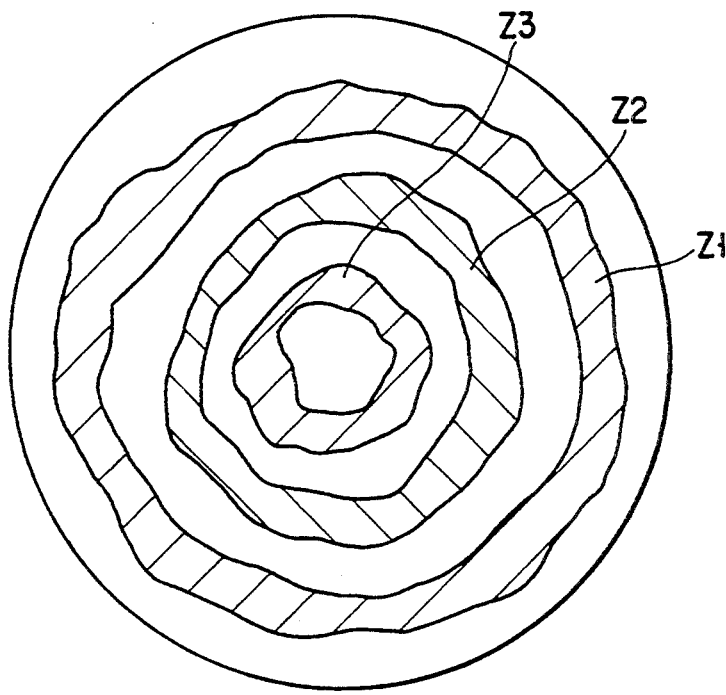
FIG. 7 is a plane view showing radiation zones at the position along line VI—VI of FIG. 4.
Figure 8:
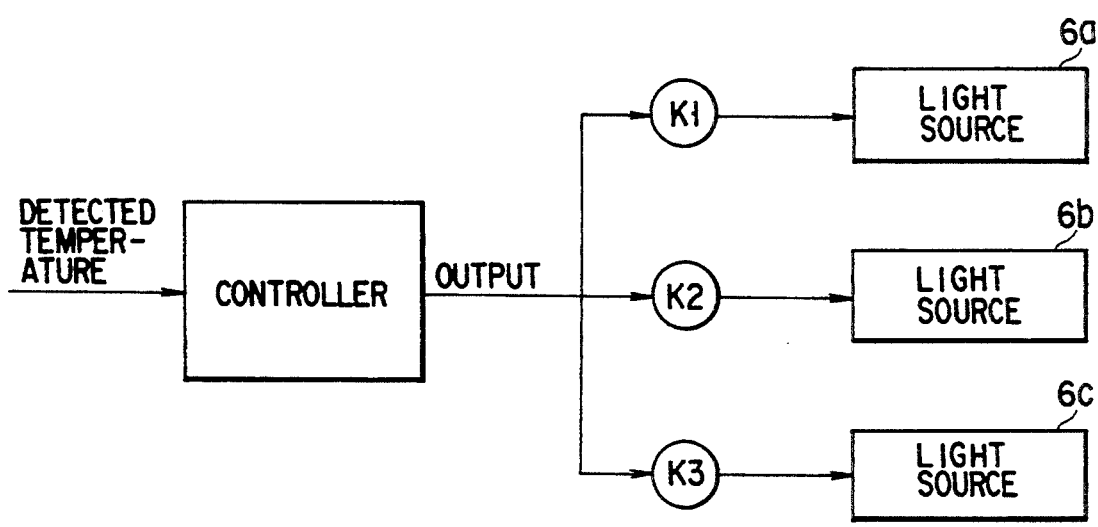
FIG. 8 is a block diagram for explaining temperature control of the apparatus of FIG. 4.

The light sources 6 are not perpendicularly directed upward. More specifically, the light sources 6 are inclined to emit light toward three different directions D1, D2, and D3. If the tables 7a and 7b are rotated, three radiation zones Z1, Z2, and Z3 are formed as shown in FIGS. 6 and 7. FIGS. 6 and 7 are a side view and a plane view showing a temperature distribution and radiation zones at the position taken along line VI—VI of FIG. 4. The light source can control the amount of light for each radiation zone.

In this embodiment, the eight light sources 6a, which are arranged outside, are oriented to the same direction D1 directing outside. On the other hand, the pair of light sources 6b and the pair of light sources 6c, which are arranged inside, are oriented to different directions D2 and D3. More specifically, the light sources 6b are oriented to the direction D2 toward outside, and the light sources 6c are oriented to the direction D3 toward inside. Due to this, the zones Z1, Z2, and Z3 shown in FIGS. 6 and 7 are formed by the light sources 6a, 6b, and 6c, respectively.

Three sensors 20a, 20b, 20c are provided to correspond to three heating zones Z1, Z2 and Z3. Each sensor detects light energy having passed through the window plate 5 for each heating zone. Similar to the first embodiment, the thermocouples are used as sensors 20a, 20b and 20c. The sensors 20a, 20b and 20c are connected to the measuring section 37 comprising an A/D converter.

Similar to the first embodiment, the sensors 20a, 20b, and 20c are used to estimate the deposition state of the by-products on the window plate 5. Detection data sent from the sensors 20a, 20b, 20c is converted to an observed value consisting of a digital signal by use of the measuring section 37. The converted signal is transmitted through the comparator 38, controller 39, PWM amplifier 33, and used to control the power supply to each of the light sources 6a, 6b and 6c of the respective heating zones Z1, Z2, and Z3. According to this embodiment, the deposition state of the by-products on the window plate 5 is locally obtained so as to correspond to the heating zones Z1, Z2 and Z3. Therefore, abnormality of the window plate 5 can be correctly confirmed. In other words, timing of cleaning or replacement of the window plate can be more correctly confirmed.

The following will explain the temperature control of the wafer in the second embodiment.

According to this embodiment, the amount of light of the light sources 6a, 6b and 6c can be controlled for each radiation zone. For example, in a case where the amount of light of the light sources to each radiation zone is equally set, the peak values of zones Z1, Z2, Z3 are substantially the constant values as shown in FIG. 6. In other words, the semiconductor wafer W mounted on the susceptor 3 is substantially equally heated.

The heat absorbing and emitting conditions of the wafer W are largely changed by depending on the processing conditions, the types of wafers, or the processing steps. Due to this, uniform heating of the wafer W cannot be necessarily attained by the equal amounts of radiation light. For example, there is a case that the amount of radiation light of the periphery is set to be higher or lower than that of the center, thereby the equal heating of the wafer can be resultingly attained.

Therefore, a plurality of patterns of the amount of radiation light as an electrical power ratio among the radiation zone, which can uniformly heat the wafer, are set in advance in accordance with the processing conditions, the types of wafers, and the processing steps by use of a sample wafer. Moreover, the patterns of the predetermined electrical power ratio are related to the output signals, which are sent from the controller for controlling electrical power to each light source, and to predetermined weighting factors (K1, K2, K3, . . . ) in advance.

As a result, according to the present invention, weighting to the output sent from the controller can be performed by only the single temperature sensor, i.e., thermocouple 19, thereby making it possible to perform suitable wafer heating control in accordance with the processing conditions, the types of wafers, and the processing atmosphere.

Figure 9:
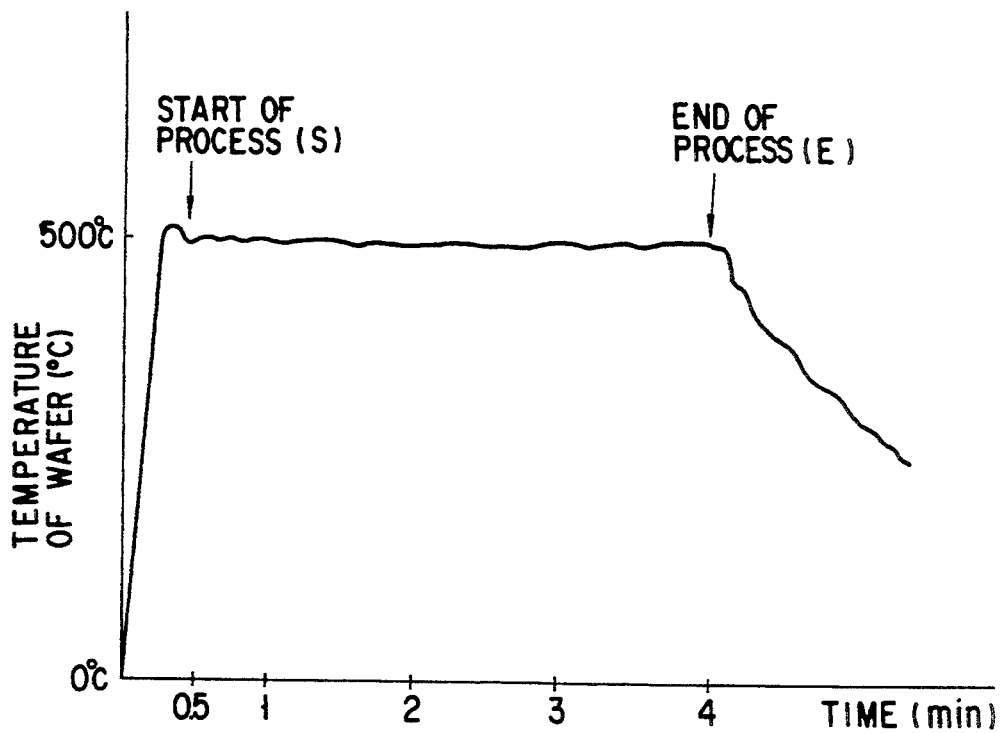
FIG. 9 is a graph showing wafer temperature change during a film formation processing.

For example, as shown in FIG. 9, in preparation heating steps (O to S), it is preferable that the temperature of an object to be processed is rapidly heated to a predetermined film formation temperature as overshoot is controlled to a minimum. On the other hand, in film formation processing steps (S to E), it is required that the temperature of the object to be processed be controlled to be uniformly maintained with high accuracy. As mentioned above, requirement for control differs even in the same processing step. Further, there are differences in the processing atmosphere depending on steps, such as existence of processing gas, and difference in pressure. In such a case, according to the conventional method, since the different temperature control is required, the temperature control cannot be attained with high accuracy, even through the output sent from the temperature sensor is kept the same.

However, according to the present invention, even under such different conditions, by changing the weighting factors (K1, K2, K3, . . . ) for the processing step, it is possible to attain suitable temperature control in accordance with the processing conditions, the types of wafers, and the processing atmosphere based on a single output sent from a single temperature sensor.

For example, in a case that temperature of 500° C. is set as a condition of a suitable film formation temperature as shown in FIG. 9, rapid heating having little overshoot can be attained by supplying electrical power, which is relatively higher than the electrical power supplied to the inner radiation zones Z2 and Z3, to the outer radiation zone Z1 in the preparation heating step (O to S). Conversely, in the film formation processing step (S to E), electrical power, which is lower than the electrical power supplied to the inner radiation zones Z2 and Z3, is supplied to the outer radiation zone Z1, so that uniformity of wafer temperature can be maintained with high accuracy.

Figure 10:
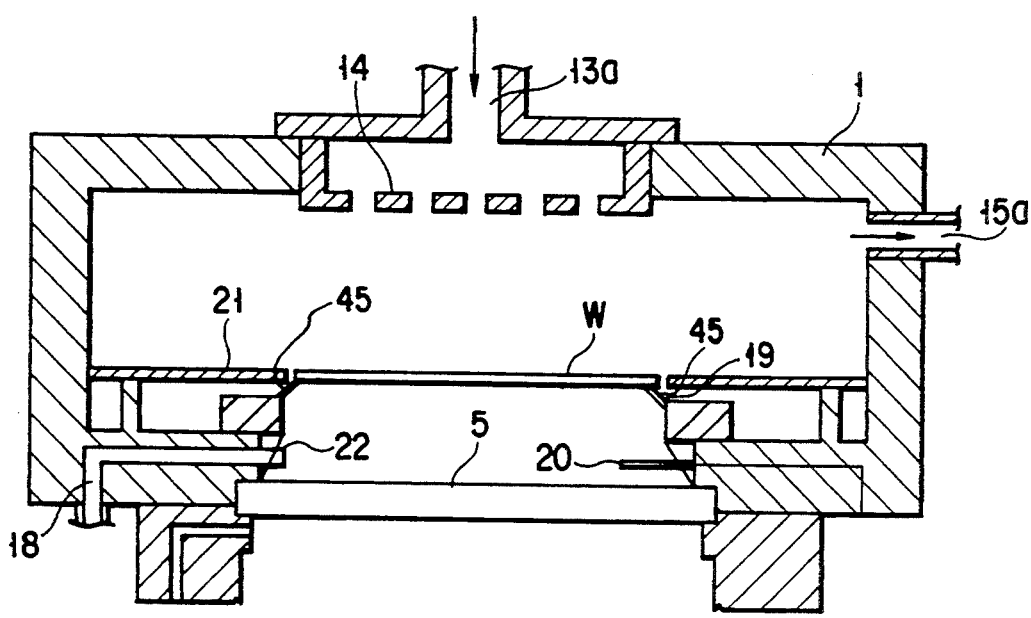
FIG. 10 is a partial cross sectional view of a modification of a wafer support portion.

The present invention was explained according to the CVD apparatus of the first and second embodiments. However, the present invention is not limited to these embodiments. For example, the susceptor 3, which support only the peripheral portion of the wafer W, may be used. Also, as shown in FIG. 10, it is possible to omit susceptor 3, and support the wafer W by a plurality of transparent quartz pins 45, e.g., three pins. One or all of the quartz pins 45 is provided with thermocouple 19. In these cases, light emitted from the light sources 6 through the window plate 5 directly heats the rear surface of the wafer W.

Moreover, the present invention can be applied to a sputtering apparatus, a laser annealing apparatus, an etching apparatus, an ashing apparatus, etc., other than the CVD device. Also, in place of the lamp formed of a heat resistance member, another light source such as a laser source can be used as a light source for heating wafer. Moreover, as an object to be processed, a glass substrate of LCD, on which a semiconductor region is formed, other than the semiconductor wafer can be included in the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor processing apparatus for processing a substrate while being optically heated, said substrate having a main surface to be processed and a rear surface reverse to said main surface, comprising:
   a processing chamber;
   supporting means, provided in said processing chamber, for supporting said substrate;
   means for substantially partitioning an interior of said processing chamber into first and second spaces, said main surface of said substrate being exposed in said first space;
   means for introducing a process gas for processing said main surface of said substrate into said first space;
   exhausting means, connected to said first space, for setting said processing chamber to a vacuum atmosphere;
   means for supplying inactive gas to said second space such that said second space has a pressure higher than that of said first space;
   a light source, provided outside said processing chamber so as to be opposite to said rear surface of said substrate, for emitting light for heating said substrate, said light source comprising a plurality of lamps arranged on a rotatable table;
   a power supply for supplying electrical power to said light source so as to emit said light;

a window plate, provided to be opposite to said light source, and forming a part of a wall of said processing chamber, said window plate transmitting said light emitted from said light source to pass therethrough;

detecting means for detecting energy of transmitted light having passed through said window plate, said detecting means having a detection terminal provided between said window plate and said substrate in said second space;

comparing means for comparing an observed value of energy of said transmitted light detected by said detecting means with a reference value representing energy of said transmitted light in an initial state of said window plate; and controlling means for estimating a state of said window plate from a comparative result between the observed value and the reference value obtained by said comparing means, and selectively stopping the power supply to said light source from said power source.

2. The apparatus according to claim 1, wherein said supporting means comprises a susceptor having a supporting surface and a rear surface, which is a reverse side of the supporting surface, and said supporting surface of said susceptor substantially entirely contacts said rear surface of said substrate, and said transmitted light is directly radiated on said rear surface of said susceptor.

3. The apparatus according to claim 1, wherein said supporting means supports said pins substrate such that said rear surface of said substrate is exposed to said second space, and said transmitted light is directly radiated on said rear surface of said substrate.

4. The apparatus according to claim 1, further comprising a sub-chamber housing said lamps and means for introducing cooling gas for suppressing overheat of said window plate into said sub-chamber.

5. The apparatus according to claim 4, wherein said process gas is a gas for forming a film on said main surface of said substrate.

6. The apparatus according to claim 5, wherein said comparing means compares an observed temperature rise curve obtained from said observed value with a reference temperature rise curve obtained from said reference value, for obtaining said comparative result.

7. A CVD apparatus for forming a film on a main surface of a substrate to be processed while being optically heated, said substrate having a main surface and a rear surface, said CVD apparatus comprising:

a processing chamber;

exhausting means for setting said processing chamber to a vacuum atmosphere;

supporting means, provided in said processing chamber, for supporting said substrate;

means for introducing process gas for forming said film on said main surface into said processing chamber;

a light source, provided outside said processing chamber, for emitting light for heating said substrate;

a power supply for supplying electrical power to said light source so as to emit said light;

a window plate, provided to be opposite to said light source, and forming a part of a wall of said processing chamber, said window plate transmitting said light emitted from said light source to pass therethrough;

detecting means for detecting energy of transmitted light having passed through said window plate, said detecting means having a detection terminal provided between said window plate and said substrate in said processing chamber;

comparing means for comparing an observed value of energy of said transmitted light detected by said detecting means with a reference value representing energy of said transmitted light in an initial state of said window plate; and controlling means for estimating a state of said window plate from a comparative result between the observed value and the reference value obtained by said comparing means, and selectively stopping the power supply to said light source from said power source, wherein said window plate and said light source are arranged opposite to said rear surface of said substrate, wherein said processing chamber comprises partitioning means for substantially partitioning the interior into first and second spaces, said main surface of said substrate being exposed in said first space, said detecting terminal of said detecting means being arranged in said second space, said means for introducing process gas and said exhausting means being directly connected to said first space, and said apparatus further comprises means for supplying inactive gas into said second space such that said second space has a pressure higher than that of said first space, and wherein said light source comprises a plurality of light source members arranged on a rotatable table.

8. The apparatus according to claim 7, wherein said comparing means compares an observed temperature rise curve obtained from said observed value with a reference temperature rise curve obtained from said reference value, for obtaining said comparative result.

9. The apparatus according to claim 7, wherein said light source members are oriented to different directions to share different-radiations zones to said substrate.

10. The apparatus according to claim 9 wherein outputs to said light source members can be controlled for each of said radiation zones.

11. The apparatus according to claim 10, wherein said detecting means comprises a plurality of detection members arranged to correspond to said radiation zones.

12. A semiconductor processing method of processing a substrate while being optically heated, said substrate having a main surface to be processed and a rear surface reverse to said main surface, by using an apparatus comprising a processing chamber, supporting means, provided in said processing chamber, for supporting said substrate, means for substantially partitioning an interior of said processing chamber into first and second spaces, said main surface of said substrate being exposed in said first space, means for introducing a process gas for processing said main surface of said substrate into said first space, exhausting means, connected to said first space, for setting said processing chamber to a vacuum atmosphere, means for supplying inactive gas to said second space such that said second space has a pressure higher than that of said first space, a light source, provided outside said processing chamber so as to be opposite to said rear surface of said substrate, for emitting light for heating said substrate, said light source comprising a plurality of lamps arranged on a rotatable table, a power supply for supplying electrical power to said light source so as to emit said light, and a window plate, provided to be opposite to said light source, and forming a part of a wall of said processing chamber, said window plate transmitting said light emitted from said light source to pass therethrough, said method comprising the steps of:

detecting energy of transmitted light having passed through said window plate by detecting means having a detection terminal provided between said window plate and said substrate in said second space;

comparing by comparing means an observed value of energy of said transmitted light detected by said detecting means with a reference value representing energy of said transmitted light in an initial state of said window plate; and estimating by controlling means a state of said window plate from a comparative result between the observed value and the reference value obtained by said comparing means, and selectively stopping by said controlling means the power supply to said light source from said power source.

13. The method according to claim 12, wherein said supporting means comprises a susceptor having a supporting surface and a rear surface which is a reverse side of the supporting surface, and said supporting surface of said susceptor substantially entirely contacts said rear surface of said substrate, and said transmitted light is directly radiated on said rear surface of said susceptor.

14. The method according to claim 12, wherein said supporting means supports said substrate such that said rear surface of said substrate is exposed to said second space, and said transmitted light is directly radiated on said rear surface of said substrate.

15. The method according to claim 12, wherein said apparatus further comprises a sub-chamber housing said lamps and means for introducing cooling gas for suppressing overheat of said window plate into said sub-chamber.

16. The method according to claim 15, wherein said process gas is a gas for forming a film on said main surface of said substrate.

17. The method according to claim 16, wherein said comparing means compares an observed temperature rise curve obtained from said observed value with a reference temperature rise curve obtained from said reference value, for obtaining said comparative result.

* * * * *